(12) United States Patent
Mitra et al.

(10) Patent No.: US 8,772,717 B2
(45) Date of Patent: Jul. 8, 2014

(54) RADIATION DETECTOR HAVING A BANDGAP ENGINEERED ABSORBER

(75) Inventors: Pradip Mitra, Colleyville, TX (US); Jeffrey D. Beck, Plano, TX (US); Mark R. Skokan, Carrollton, TX (US)

(73) Assignee: DRS RSTA, Inc., Melbourne, FL (US)

( * ) Notice: Subject to any disclaimer, the term of this patent is extended or adjusted under 35 U.S.C. 154(b) by 738 days.

(21) Appl. No.: 12/853,174

(22) Filed: Aug. 9, 2010

(65) Prior Publication Data

US 2011/0031401 A1    Feb. 10, 2011

(51) Int. Cl.
*G01J 5/00* (2006.01)

(52) U.S. Cl.
USPC ................... 250/338.1; 250/338.2

(58) Field of Classification Search
USPC .................................. 250/338–339
See application file for complete search history.

(56) References Cited

U.S. PATENT DOCUMENTS

| | | | |
|---|---|---|---|
| 7,009,180 B2 * | 3/2006 | Sterling et al. | 250/339.12 |
| 2002/0020859 A1 * | 2/2002 | Muramatsu | 257/228 |
| 2007/0285538 A1 * | 12/2007 | Suzuki | 348/272 |
| 2009/0121307 A1 * | 5/2009 | Tennant | 257/440 |

OTHER PUBLICATIONS

Beck, J., et al., "The HgCdTe Electron Avalanche Photodiode", Journal of Electronic Materials, vol. 35, No. 6., 2006, pp. 1166-1173.
Beck, J. et al., "The HgCdTe Electron Avalanche Photodiode", IEEE LEOS Newsletter, Oct. 2006, pp. 8-12.

* cited by examiner

*Primary Examiner* — Matthew Mikels
(74) *Attorney, Agent, or Firm* — Kilpatrick Townsend & Stockton LLP

(57) ABSTRACT

A radiation detector is provided that includes a photodiode having a radiation absorber with a graded multilayer structure. Each layer of the absorber is formed from a semiconductor material, such as HgCdTe. A first of the layers is formed to have a first predetermined wavelength cutoff. A second of the layers is disposed over the first layer and beneath the first surface of the absorber through which radiation is received. The second layer has a graded composition structure of the semiconductor material such that the wavelength cutoff of the second layer varies from a second predetermined wavelength cutoff to the first predetermined wavelength cutoff such that the second layer has a progressively smaller bandgap than the first bandgap of the first layer. The graded multilayer radiation absorber structure enables carriers to flow toward a conductor that is used for measuring the radiation being sensed by the radiation absorber.

17 Claims, 8 Drawing Sheets

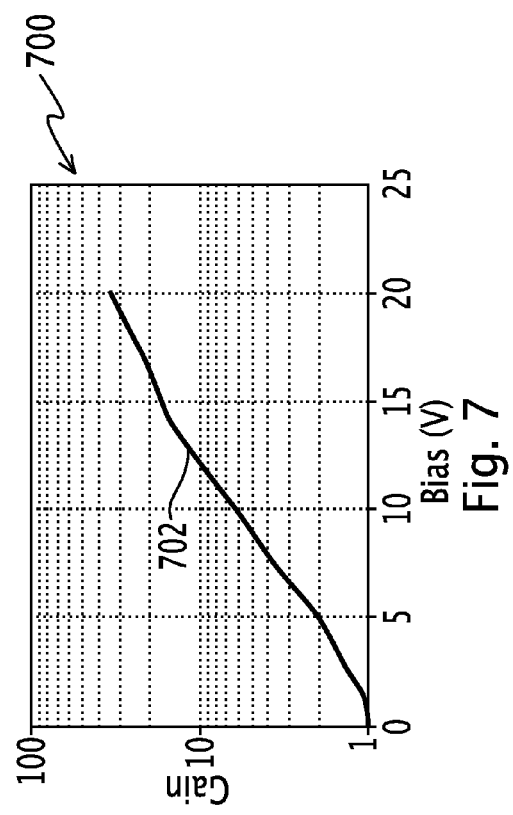
Fig. 7
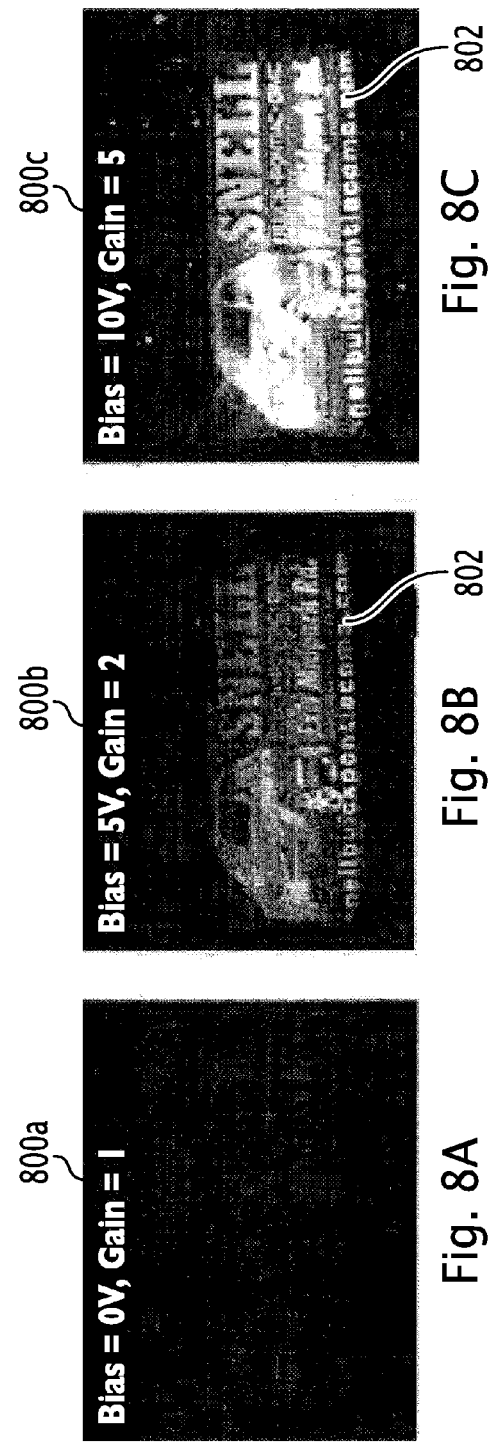
Fig. 8A
Fig. 8B
Fig. 8C

# RADIATION DETECTOR HAVING A BANDGAP ENGINEERED ABSORBER

FIELD OF THE INVENTION

The principles of the present invention relate to imaging devices. More particularly, the principles of the present invention relate to a radiation detector, such as an infrared detector having a progressively graded bandgap or variable bandgap multilayer structure in which the detector's bandgap multilayer structure takes advantage of a longer cutoff region while minimizing the penalty associated with the added dark current of the longer cutoff region by confining this region to a thin layer within the graded or multilayer structure.

BACKGROUND OF THE INVENTION

Photodiodes have been configured in many ways and use many different materials for absorbing light energy over different wavelengths to generate photocurrent or voltage depending upon the mode. Temperature affects dark current as higher temperature increases dark current and degrades the noise equivalent sensitivity of the device. To achieve increased sensitivity, temperature is typically reduced. To reduce temperature, however, more power is needed to cool the detector. In addition, the cooling systems are necessarily larger and more expensive.

High density vertically integrated photodiode (HDVIP®, a trademark of DRS Technologies, Inc.) architecture has been employed to form pixels in focal plane arrays (FPAs) used for an infrared radiation detection. Photodiodes formed in prior art HDVIP® infrared detectors typically are formed from a single homogenous semiconductor layer of Mercury Cadmium Telluride ("HgCdTe") to have a given wavelength cutoff. Such prior art infrared detectors employing photodiodes formed of HgCdTe are susceptible to noise due to thermally excited current carriers and dark current sources at high operating temperatures and, thus, require substantial cooling to reduce the operating temperature of the detector so as to correspondingly reduce the noise and dark current of the detector.

Therefore, there has always been a need for an infrared radiation detectors that operate at higher temperatures without degradation in performance.

SUMMARY OF THE INVENTION

In accordance with imaging devices consistent with the principles of the present invention, a radiation detector is provided including an improved photodiode. The photodiode may have a radiation absorber having a first surface upon which radiation is received into the absorber. The absorber may have multiple layers each formed from a semiconductor material, such as $Hg_{1-x}Cd_xTe$. A first of the layers may be formed of a homogenous composition of the semiconductor material to have a first predetermined wavelength cutoff (e.g., 2 microns for the SWIR band). A second of the layers may be disposed over the first layer and beneath the first surface of the absorber. The second layer may have a graded composition structure of the semiconductor material such that the second layer has a wavelength cutoff that varies from a second predetermined wavelength cutoff (e.g., 1.5 microns for the SWIR band) to the first predetermined wavelength cutoff (e.g., 2 microns). The first layer of the absorber of the photodiode preferably has a thickness that is substantially small (e.g. 0.2 microns or less in the SWIR example). The first layer of the absorber of the photodiode may have a thickness that is less than 0.2 microns and the second graded composition layer of the absorber may have a thickness that is greater than 0.2 microns. The structure of the graded multilayer absorber may be such that the second graded layer has a progressively smaller bandgap than the first layer. As a result of the progressively decreasing bandgap layers, carriers that are generated in the semiconductor material in response to light at wavelengths at or below the respective predetermined wavelength cutoffs drift through each of the layers until reaching the first, thin layer of the absorber because of the decreasing bandgaps or increasing wavelength cutoffs (e.g., 1.5 µm, 1.8 µm, 2.0 µm, and 2.2 µm).

The n-type and p-type regions of the photodiode may be formed of the same graded multilayer material structure. In this implementation, a p-type region of the photodiode and the n-type region of the photodiode may have the identical layer structure.

In one implementation, the absorber of the photodiode may have a third layer disposed on the second layer and defining the first surface of the absorber. The third layer may be formed of a homogenous composition of $Hg_{1-x}Cd_xTe$ to have the second predetermined wavelength cutoff. The third layer has a third energy bandgap that is greater than the energy bandgap of the second layer such that (i) carriers generated by radiation absorbed in the third layer (e.g., radiation less than the second predetermined wavelength cutoff of 1.5 microns for the SWIR band) drift to the second graded layer and (ii) carriers generated by radiation absorbed in the second layer (e.g., radiation between the second predetermined wavelength cutoff of 1.5 microns and the first predetermined wavelength cutoff of 2.0 microns for the SWIR band) drift to the first layer having the narrowest bandgap of the three absorber layers.

One embodiment of a radiation detector may include a photodiode including a radiation absorber having a first surface upon which radiation is received into the absorber. The absorber may have multiple layers, where each layer is formed from a semiconductor material. A first of the layers may be formed to have a first predetermined wavelength cutoff, a second of the layers may be disposed over the first layer and beneath the first surface of the absorber. The second layer may have a graded composition structure of the semiconductor material such that the second layer has a wavelength cutoff that varies from a second predetermined wavelength cutoff to the first predetermined wavelength cutoff.

One embodiment of a method for sensing radiation may include receiving radiation by a first radiation absorption layer. In response to receiving the radiation by the first radiation absorption layer, photogenerated carriers may be generated. The composition gradient results in gradient in the bandgap that creates an electric field gradient which pushes photogenerated carriers towards the narrow bandgap layer. A signal representative of the photogenerated and drifted carriers may be output for measuring the sensed radiation. At low applied reverse bias voltages, such as at ≤0.2 V, it behaves like a standard gain=1 photodiode. At higher reverse bias voltages, such as ≥3 V for MWIR and ≥6V, the n-type region begin to become depleted. The vertical drift of the photogenerated carriers makes the depleted narrow gap n-type region the region where avalanche multiplication occurs. Higher avalanche multiplication gains can thus be realized, as compared to a single homogeneous composition $Hg_{1-x}Cd_xTe$ absorber layer. The exact gain will depend on the applied bias and the composition of the narrow bandgap layer.

One embodiment of manufacturing a photodiode may include providing a substrate. A first passivation layer may be deposited or otherwise grown on the substrate. A bandgap engineered absorber may be deposited onto the passivation layer. A second passivation layer may be deposited onto the bandgap engineered absorber. The second passivation layer may be bonded onto a readout integrated circuit layer, where the readout integrated circuit includes a conductor. The substrate may be removed from the first passivation layer, thereby exposing the first passivation layer. A via may be formed through the absorber and passivation layers to form p/n-junctions on both sides of the via. The n-side of the p/n-junctions of the via may be connected to the conductor of the readout input circuit through a metal layer of the via.

Other devices, systems, methods, and features of the principles of the present invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings:

FIG. 7 is a graph of an illustrative avalanche diode gain of a photodiode having a HDVIP® structure with a homogeneous absorber structure, where higher gain at the corresponding bias voltages are expected to be realized with a graded absorber structure in accordance with the principles of the present invention;

FIGS. 8A-8C are images of an illustrative scene produced by three different operating conditions (e.g., three different bias voltages) in which an optical detector with absorber pixels having homogeneous absorber structures with the HDVIP® structure is set, where increased signal to noise ratio is expected to be realized with the HDVIP® structure with a graded absorber structure in accordance with the principles of the present invention.

DETAILED DESCRIPTION OF THE INVENTION

A photodiode is an electronic sensor that converts radiation into current or voltage signals. Imaging devices, such as photodiodes, consistent with the principles of the present invention may provide an HDVIP® radiation detector with an improved photodiode structure as an alternative to the conventional HDVIP® radiation detectors with photodiodes formed using liquid phase epitaxy (LPE) to have a single homogenous semiconductor layer of $Hg_{1-x}Cd_xTe$ with a given wavelength cutoff. The improved photodiode structure of the HDVIP® radiation detector reduces dark current densities as compared to the conventional HDVIP® radiation detector or increases the operating temperature of each pixel employing the structure and the focal plane array (FPA) of pixels as a whole. In one embodiment, the photodiode structure incorporates a thin, narrow bandgap layer beneath a thicker, larger bandgap layer having a bandgap engineered absorber, such as a graded composition of $Hg_{1-x}Cd_xTe$. Carriers associated with the radiation absorbed in the graded layer drift to underlying narrower bandgap layers. The thin, narrow bandgap layer increases electronic avalanche photodiode (e-APD) gain on the detector at a given bias voltage as compared to the conventional HDVIP® detectors having the single homogenous semiconductor layer of $Hg_{1-x}Cd_xTe$, for example. It should be understood that alternative material and structure that provide for the functionality of the present invention may be utilized.

Figure 1:
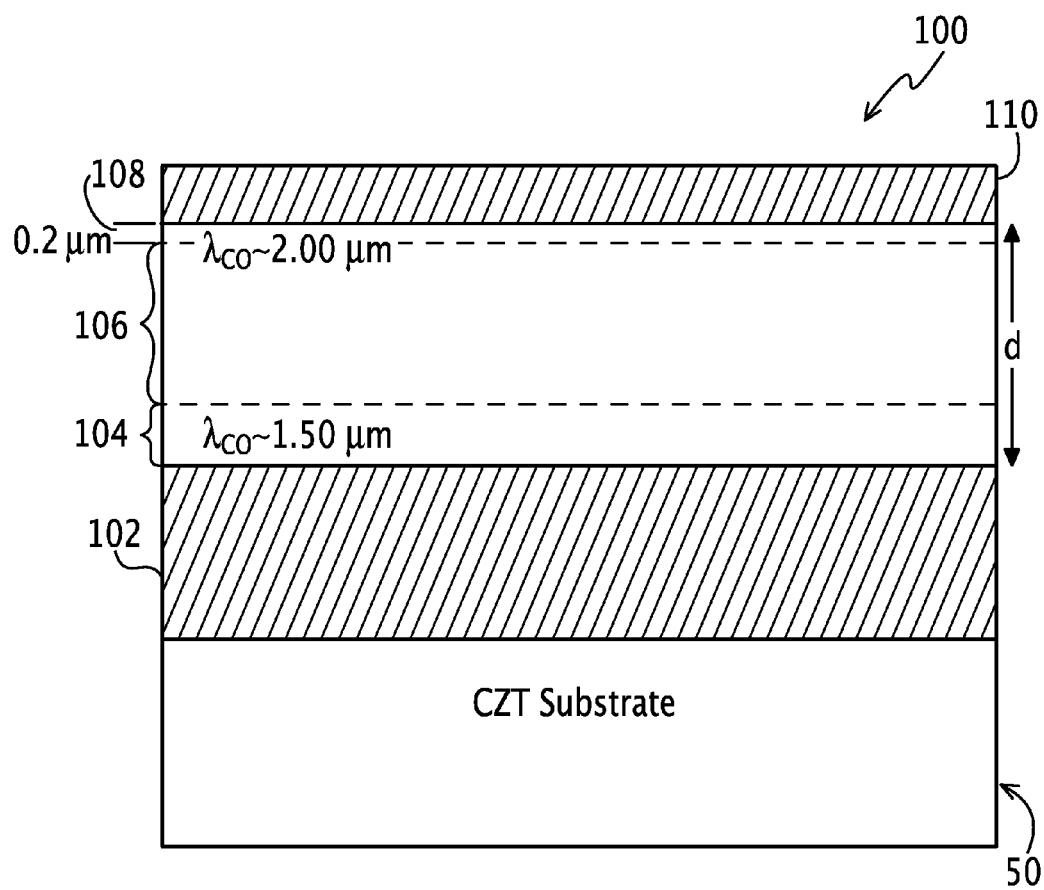
FIG. 1 depicts an exemplary graded multilayer material structure formed or as grown in accordance with the principles of the present invention for use in implementing a graded multilayer absorber of a photodiode (such as a high density vertically integrated photodiode (HDVIP®)), in a pixel 200 of an infrared radiation detector.
Figure 2:
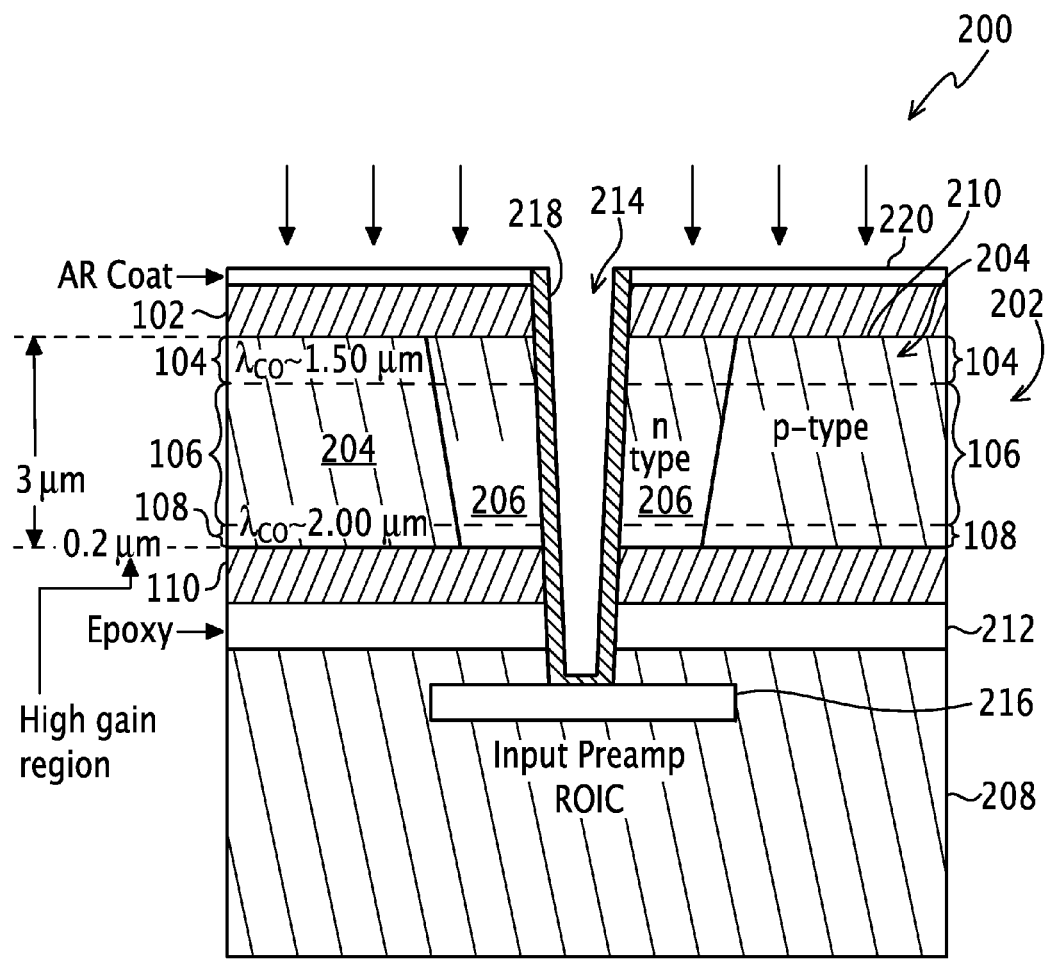
FIG. 2 depicts an exemplary pixel of an infrared radiation detector having a HDVIP® structure in which the photodiode of the pixel is formed to have an upside-down graded multilayer absorber shown in FIG. 1.

FIG. 1 depicts an exemplary graded multilayer material structure 100 formed in accordance with the principles of the present invention for use in implementing a graded multilayer absorber 204 of a photodiode 202, such as a high density vertically integrated photodiode (HDVIP®), in a pixel 200 of an infrared radiation detector as shown in FIG. 2. For clarity and brevity in the discussion to follow, the graded multilayer material structure 100 and the pixel 200 of the infrared radiation detector is described in reference to a specific example of a Short Wave Infrared detector (SWIR) that embodies the invention. However, the graded or multilayer material structure 100 is applicable to the Medium Wave Infrared (MWIR) and Long Wave Infrared (LWIR) bands and the formation of a MWIR or LWIR detector having a photodiode with a graded or multilayer absorber (or with p-type and n-type regions having the graded multilayer material structure 100). Similarly, other components of the radiation detector shown in FIG. 2 besides the pixel 200 are not shown in the figures to avoid obscuring the principles of the present invention.

As shown in FIG. 1, the graded or multilayer material structure 100 is formed on a substrate 50. The substrate 50 may be of a material that has a lattice structure that matches lattice structure of the graded multilayer material structure 100, which when formed, may be removed from the substrate 50 after the structure 100 is placed on a readout IC structure 208 of the pixels 200 that collectively form a focal plane array (FPA) of the radiation detector. In the implementation shown in FIG. 1, the substrate 50 includes Cadmium Zinc Telluride ($Cd_{1-y}Zn_yTe$ or CZT), which has a lattice constant that matches the $Hg_{1-x}Cd_xTe$ material (also referenced as MCT) used in forming a wide energy bandgap passivation and buffer layer 102 as well as the bandgap layers 104, 106, and 108 of the graded multilayer material structure 100 used to implement the absorber 204 of the photodiode 202 in the pixel 200. As understood in the art, the passivation and buffer layer 102 is used to protect absorption layers, such as bandgap layer 104, and to prevent recombination of carriers, which reduces operating performance of the imaging device.

Initially, a buffer layer and a wide bandgap passivation layer 102 is grown on the substrate 50. Note, each of the layers 102, 104, 106, 108 and 110 of the graded multilayer material structure 100 may be grown using a known vapor phase epitaxy technique, such as molecular beam epitaxy (MBE) or metalorganic vapor phase epitaxy (MOVPE).

Next, to implement absorber 204 of photodiode 202 (FIG. 2) for detecting wavelengths in the SWIR band, a homogenous layer 104 of $Hg_{x-1}Cd_xTe$ may be formed on the passivation and buffer layer 102 to have a thickness of approximately 1 μm. Although in this implementation of forming the graded multilayer material structure 100 the homogeneous layer 104 is deposited on the buffer layer 102 before the remaining layers 106 and 108, the layer 104 represents the "third layer" in the stack of layers 108, 106 and 104 of the photodiode 202 closest to the readout IC layer 208 (i.e., the graded multilayer structure 100 is placed upside-down on the readout IC layer 208). When the graded multilayer material structure 100 is used to form the photodiode 202, the layer 104 defines a first surface 210 of the absorber 204 upon which radiation is received into the absorber 204 of the photodiode 202. Thus, in the implementation shown in FIGS. 1 and 2, radiation is received and absorbed in the absorber layers 104, 106 and 108 of the photodiode 202 in reverse order from the order in which the layers 104, 106 and 108 are formed in the graded multilayer material structure 100.

In one embodiment, the composition of Cd and Hg is set in the layer 104 so that the layer 104 has a wavelength cutoff of approximately 1.5 μm ("the predetermined wavelength cutoff"). Although each of the layers 104, 106, and 108 used to form the absorber 204 (e.g., p-type region in FIG. 2) and the detection region (e.g., the n-type region in FIG. 2) of the photodiode 202 is described as being formed of $Hg_{x-1}Cd_xTe$, each of the layers 104, 106, and 108 may be formed of another semiconductor material (such as PbSnTe, GaInSb or InGaAs) in which the composition of elements, including the semiconductor material, may be set so that the respective layer has a single predetermined wavelength cutoff for layers 104 and 108 (and corresponding bandgap) or a graded range of wavelength cutoffs (and corresponding graded bandgap range) for layer 106, as further described in detail herein.

After the layer 104 is formed, a second layer 106 of $Hg_{x-1}Cd_xTe$ (or other semiconductor material) is disposed over or grown on the layer 104 to have a second thickness (e.g., 1.8 μm for the SWIR example) that is greater than the thickness of the layer 104 and greater than the subsequent homogenous layer 108 of $Hg_{1-x}Cd_xTe$. Thus, most of photogeneration of the carriers would occur in wider bandgap $Hg_{1-x}Cd_xTe$ with lower dark current density. The second layer 106 may have a graded composition structure of $Hg_{x-1}Cd_xTe$ (or other semiconductor material) such that the second layer 106 has a wavelength cutoff that varies from 1.5 μm (the "second predetermined wavelength cutoff") to 2.0 μm (the "first predetermined wavelength cutoff"). For example, the mole fraction (x) of Cd may vary from 0.662 to form the 1.5 μm wavelength cutoff to 0.536 to form the 2.0 μm wavelength cutoff for the SWIR band. In this example, the mole fraction (1−x) of Hg is correspondingly varied from 0.338 to form the 1.5 μm wavelength cutoff to 0.464 to form the 2.0 μm wavelength cutoff for the SWIR band.

As described above, the second absorber ranges between a first wavelength cutoff (e.g., 1.5 μm) and a second wavelength cutoff (e.g., 2.0 μm). The specific values of the wavelength cutoffs are set using the specific composition of the material used to form the second absorber layer 106. In the case of using $Hg_{x-1}Cd_xTe$, a Cd to Hg ratio, which is generally known as the Cd mole fraction, is used to set and adjust the specific wavelength cutoff as the second layer 106 is grown. As an example, if the Cd mole fraction ranges from 0.6 to 0.4, the wavelength cutoff may range from 1.5 μm to 2.0 μm. It is understood that composition of semiconductor material can be closely controlled when growing the layers through use of a software program executing on a molecular beam epitaxy machine.

After the second graded layer 106 is formed, the homogenous layer 108 of $Hg_{x-1}Cd_xTe$ (or other semiconductor material) may be disposed over or grown on the graded layer 106 to have a thickness of 0.2 μm or less (the "first thickness") for the SWIR band that is less than the thickness of the graded layer 106. In forming the layer 108, the mole fraction of Cd (x) may be set so that the layer 108 has a wavelength cutoff of 2.0 μm (the "first predetermined wavelength cutoff") to substantially match the end of the cutoff range of the graded layer 106, where substantially matching the cutoff range means to be within a few percentage points. The thickness of the layer 108 is set to be the thinnest layer in the stack of layers 104, 106, and 108 forming the n-type region 206 and the p-type region 204 (e.g., the absorber region) of the photodiode 202 to be formed as described below. The thickness of the thinnest layer 108 is optimized to a thickness that reflects a tradeoff between dark current at a desired temperature of operation and functionality of the photodiode 202. The thickness of the thinnest layer 108 also provides for a multiplication region when the photodiode is biased up to operate as an electron avalanche photodiode.

In the example show in FIG. 1, the combined thickness (d) of the graded multilayer absorber structure (i.e., layers 104, 106 and 108 in this embodiment) is approximately 3 μm for the SWIR band. However, the combined thickness may be made thinner or thicker for SWIR and other bands (such as MWIR or LWIR bands) without departing from the principles of the present invention.

The graded multilayer absorber structure (i.e., layers 104, 106 and 108 in this embodiment) may be doped with As at $(1-2)\times10^{16}$ $cm^{-3}$ or other dopants such as Hg vacancy or copper, to form a p-type structure that may be used to subsequently form the photodiode 202 of the pixel 200 in the infrared radiation detector as shown in FIG. 2. After doping, another passivation layer 110 of a wider energy bandgap of MCT so that the absorber structure is sandwiched between the passivation layers 102 and 110.

In another implementation, the passivation layer 110 (or another layer of $Hg_{x-1}Cd_xTe$ not shown) that is formed over the thinnest layer 108 may formed to have a reverse graded wavelength cutoff with a progressively larger cutoff than the layer 108 in the absorber structure. That is, a reverse graded cutoff from 2.0 μm to 1.5 μm for the SWIR band may be formed over the layer 108 to further ensure that the photogenerated carriers held in the layer 108 are readout through the corresponding layer 104 in the n-region 206 of the photodiode 202. Since the layer 108 is the thinnest layer in the n-region 206 and p-type absorber region 204, the majority of photogenerated carrier multiplication (and corresponding gain) occurs in the layer 108 of the n-region 206 when the photodiode 202 is readout through the readout IC layer 208 as further described herein.

Turning to FIG. 2, to form the HDVIP® structure with the photodiode 202 employing the graded multilayer absorber structure (e.g., layers 104, 106 and 108), the structure 100 is positioned over and bonded to a readout IC 208 such that absorber layer 108 having the narrowest bandgap as compared to the absorber layers 104 and 106 is closest to the readout IC layer 208. The structure 100 may then be bonded to the readout IC layer 208 via an epoxy layer 212 or using another known bonding technique. The substrate 50 may then be subsequently removed from the structure 100. An anti-reflection (AR) coating layer 220 may then be formed over the passivation layer 102.

Next, a hole or via 214 may be formed through the structure 100 (and the absorber layers 104, 106 and 108) using a known mechanical or chemical etching technique to reach a conductor (not shown) of an input preamp 216 or other component in the pixel readout IC layer 208. In the example shown in FIG. 2, the etching step followed by an implant, such as with Boron, causes the p-typed (As doped) absorber layers 104, 106 and 108 such that the area 206 surrounding the via 214 is converted to an n-type region. However, the graded multilayer material structure 100 otherwise remains unchanged such that the p-type absorber 204 of the photodiode 202 and the n-type region 206 each have the same plurality of $Hg_{x-1}Cd_xTe$ (or other semiconductor material) layers 104, 106 and 108 with corresponding wavelength cutoffs as viewed from the top or first surface 210 of the p-type absorber 204 (i.e., 1.5 μm wavelength cutoff for layer 104, 1.5 μm to 2.0 μm wavelength cutoff for graded layer 106, and 2.0 μm wavelength cutoff for layer 108 for the SWIR band, where each of the cutoffs are approximate values).

After the etching step and the formation of the n-type absorber or region 206 (the "detection region") of the photodiode 202, a metal layer 218 may then be formed in the via 214 to form a contact between the n-type detection region 206 of the photodiode 202 and the readout IC 208.

In the HDVIP® radiation detector configuration shown in FIG. 2, radiation incident on the surface 210 of the absorber 204 of the photodiode 202 with wavelengths less than 1.5 μm is absorbed in the absorber layer 104. Radiation having wavelengths in the graded cutoff range (e.g., 1.5 μm to 2.0 μm) passes through the layer 104 and is absorbed in the second absorber layer 106. Some radiation having wavelengths less than the cutoff of the first absorber layer 108 (e.g., 2.0 μm) may pass through the layers 104 and 106 and be absorbed in the absorber layer 108 closest to the readout IC layer 208. The photogenerated carriers generated by radiation absorbed in the top or third absorber layer 104 drift or flow from the wider bandgap of the layer 104 to the narrower graded bandgap region of the second graded absorber layer 106 due to an electric field gradient. The photogenerated carriers generated in the graded absorber layer 106 and carriers drifting from the layer 104 continue to flow or drift from the wider graded bandgap of the layer 106 to the narrower bandgap of the layer 108, where the carriers remain trapped until "detected" through the corresponding layer 108 in the n-region 206 of the photodiode 202 and readout to the readout IC 208 for the respective pixel 200 of the radiation detector.

To emphasize how the graded bandgap region operates, in the case of a homogeneous absorber layer, electrons that are generated drift to the metal layer 218 of the via 214. The metal layer 218 conducts the carriers to the conductor of the input preamp 216. By contrast, in response to applying a bias voltage to the graded bandgap structure, an electric field gradient is generated in the graded bandgap structure. Using graded bandgap with the electric field gradient causes carriers that are generated by the bandgap engineered absorber, layers 104, 106, and 108, to be forced or drift both vertically through the graded bandgap to the thinnest bandgap layer 108 and horizontally to the metal layer 218 of the via 214.

At high bias voltages for readout of the photodiode 202 in the e-APD mode, the gain multiplication occurs almost entirely in the narrowest bandgap n-region of the 2.0 μm cutoff absorber layer 108. As described in the examples to follow, the graded structure of the absorber 204 and the n-region of the photodiode 202 provides the benefit of the HDVIP® architecture while achieving higher gain from the narrowest bandgap and longest cutoff region (e.g., the 2.0 μm cutoff absorber layer 108 for the SWIR band) while reducing dark current noise than prior art HDVIP® radiation detectors that utilize a single homogenous absorber and n-type region for the photodiode.

Figure 3:
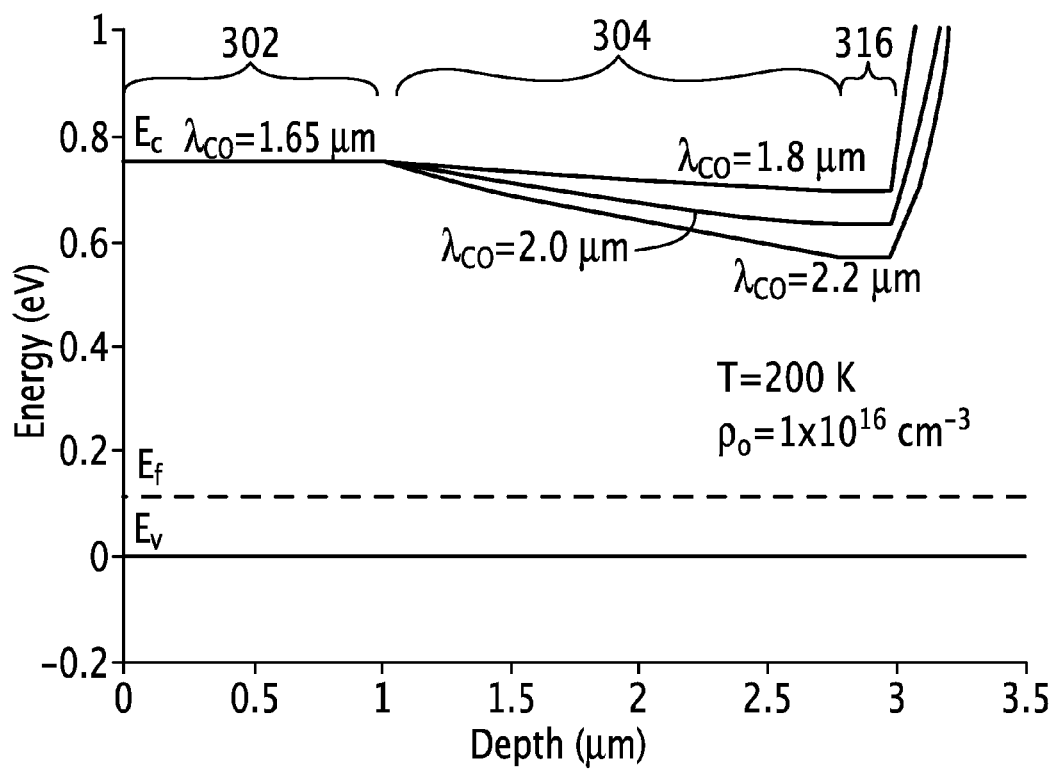
FIG. 3 is a graph depicting illustrative progressively narrower bandgaps of the graded multilayer absorber of each of several photodiodes formed in accordance with the principles of the present invention.

Turning to FIG. 3, a graph is shown that depicts the progressively narrower bandgaps of the graded multilayer absorber structure of three photodiodes formed in accordance with the principles of the present invention, such as the photodiode 202 in FIG. 2. In the implementation shown in FIG. 3, for each of the three photodiodes 202, the third absorber layer 104 defining the radiation incident surface 210 of the photodiode absorber 204 is formed to have a wavelength cutoff of 1.65 μm, which has a corresponding energy bandgap 302 of approximately 0.752 eV for the SWIR band.

In this implementation, the second absorber layer 106 of each of the three photodiodes 202 is formed to have a graded wavelength cutoff range from 1.65 μm to 1.8 μm, 2.0 μm, or 2.2 μm, respectively. Alternative cutoff ranges could be utilized as well. As shown in FIG. 3, the energy bandgap 304 of the second graded layer 106 of each of the three photodiodes drops from approximately 0.752 eV to approximately 0.689 eV for the cutoff of 1.8 μm, approximately 0.620 eV for the cutoff of 2.0 μm, and approximately 0.564 eV for the cutoff of 2.2 μm.

Continuing with the example shown in FIG. 3 for the SWIR band, the first absorber layer 108 of each of the three photodiodes 202 is formed to have a wavelength cutoff and energy bandgap 306 that matches the end of the graded cutoff range of the second absorber layer 106 (i.e., 1.8 μm cutoff with corresponding bandgap of 0.689 eV, 2.0 μm cutoff with corresponding bandgap of 0.620 eV, or 2.2 μm cutoff with corresponding bandgap of 0.564 eV).

As shown in FIG. 3, photodiodes 202 formed to have a graded multilayer absorber 204 (p-type region) and detection region 206 (n-type region) consistent with the principles of the present invention have corresponding progressively narrower bandgaps 302, 304 and 306 that cause photogenerated carriers to drift or flow to the first layer 108 having the narrowest bandgap 306 and corresponding deepest level for readout to the readout IC 208.

The third layer 104 in the stack of the absorber 204 may be formed as described herein to have a shorter wavelength cutoff (e.g., 1.5 μm) and a greater energy bandgap 302 (e.g., 0.827 eV corresponding to 1.5 μm). In this implementation, the second graded absorber layer 106 is formed to have a beginning wavelength cutoff and corresponding beginning bandgap 304 that matches that of the third absorber layer 104 so that the overall electrical field gradient of the bandgap 304 is increased so that the photogenerated carriers drift more rapidly to the narrow bandgap of the first absorber layer 108 of the respective photodiode 202.

Figure 4:
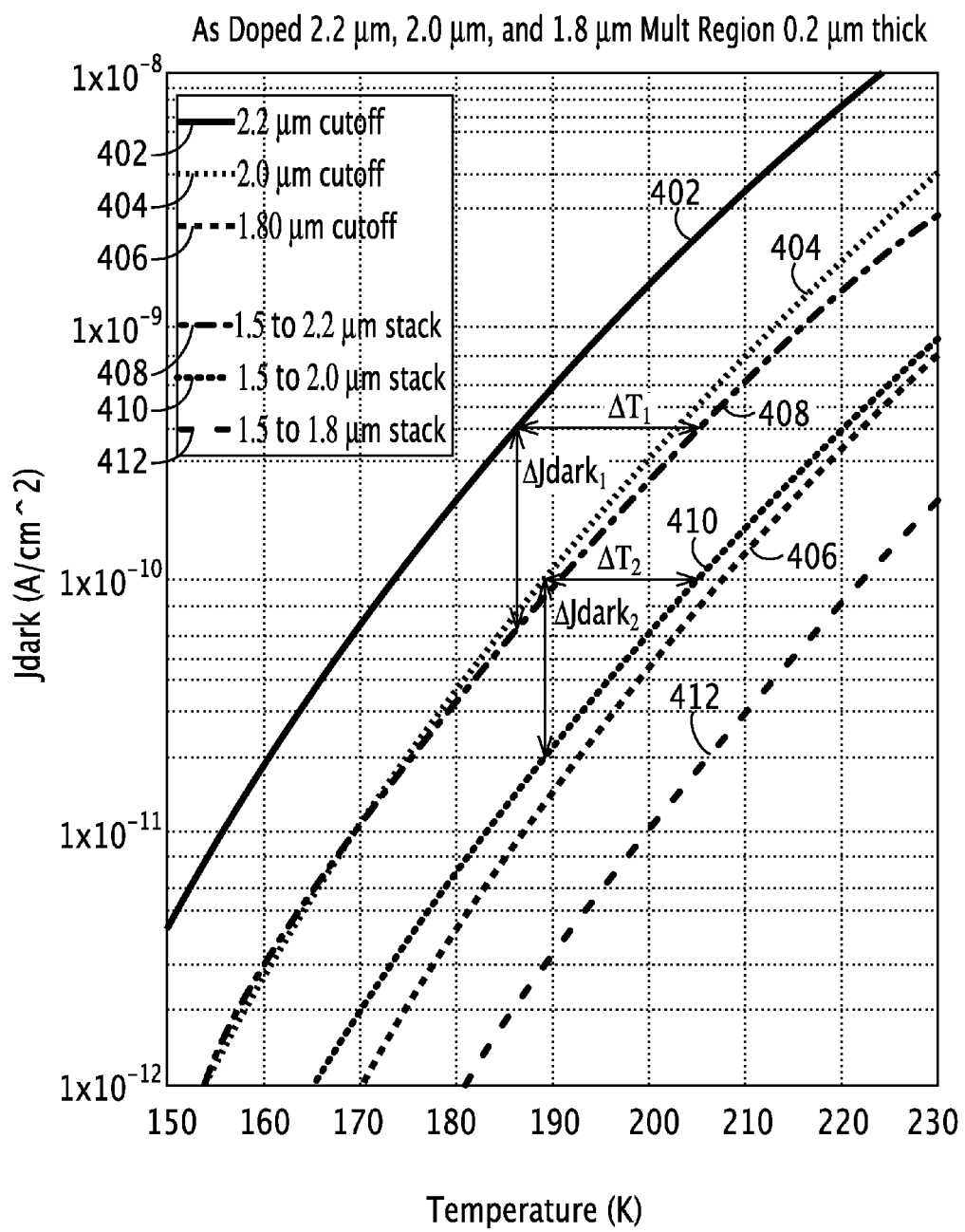
FIG. 4 is a graph showing illustrative modeling results comparing variation in dark current density as a function of operating temperature for pixels having a HDVIP® structure with a photodiode having a single homogenous absorber layer of HgCdTe for a given wavelength cutoff versus pixels having a HDVIP® structure with a photodiode having a graded multilayer absorber structure of HgCdTe as shown in FIG. 2 graded to have a corresponding wavelength cutoff.
Figure 5:
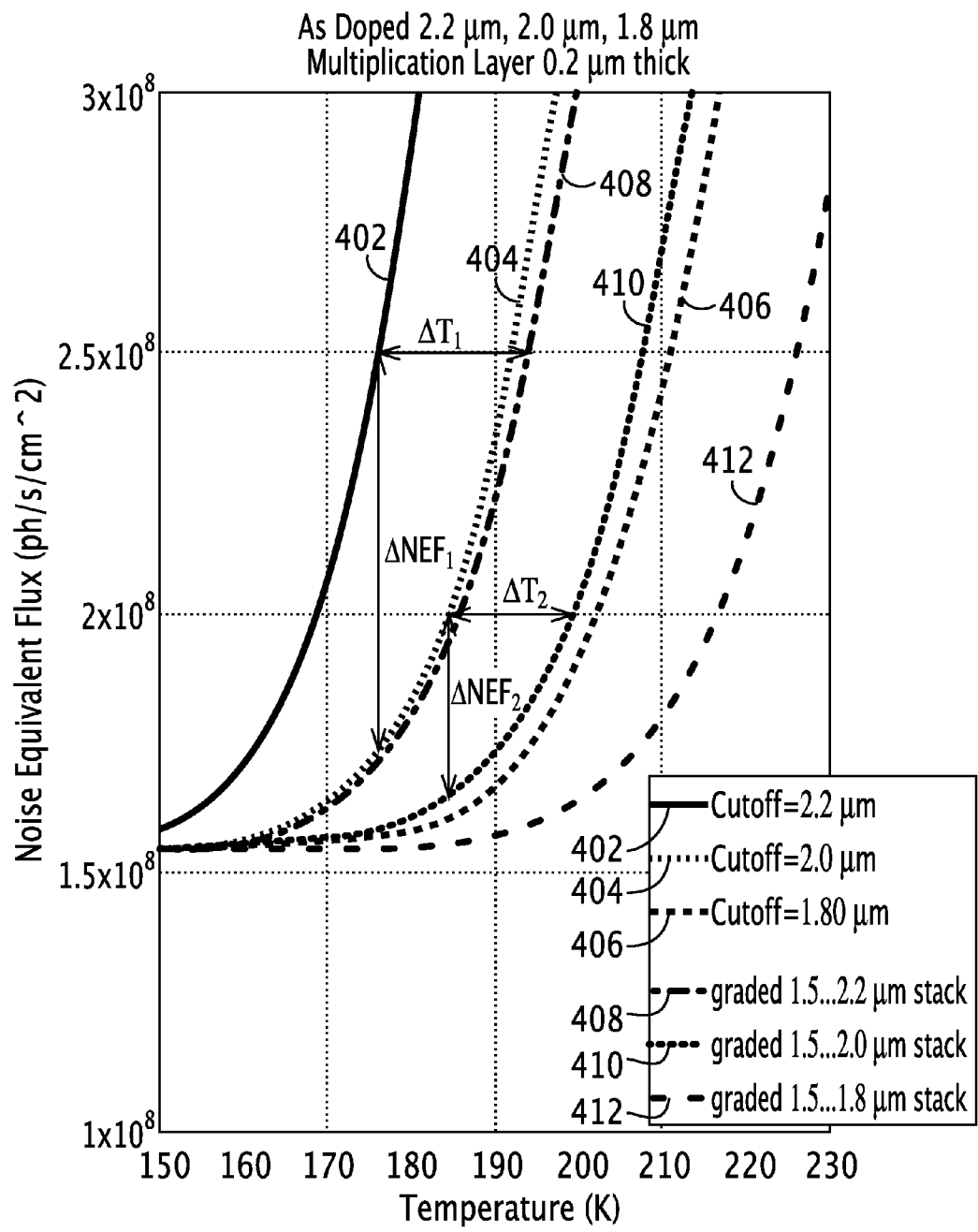
FIG. 5 is a graph showing illustrative modeling results comparing variation in noise equivalent flux or irradiance as a function of operating temperature for pixels having a HDVIP® structure with a photodiode having a single homogenous absorber layer of HgCdTe for a given wavelength cutoff versus pixels having a HDVIP® structure with a photodiode having a graded multilayer absorber structure of HgCdTe as shown in FIG. 2 graded to have a corresponding wavelength cutoff.

The properties of a photodiode 202 having a graded multilayer absorber architecture in accordance with the principles of the present invention may be observed in the comparison examples shown in FIGS. 4 and 5. FIG. 4 is a graph depicting an illustrative variation in dark current density as a function of operating temperature for pixels having an HDVIP® structure with a photodiode having a single homogenous absorber layer of HgCdTe for a given wavelength cutoff versus pixels having an HDVIP® structure with a photodiode having a graded multilayer absorber structure of HgCdTe consistent with the photodiode 202 in the pixel 200 of the HDVIP® radiation detector described herein. Three HDVIP® radiation detectors having a photodiode (referenced as 402, 404 and 406) with a single homogenous p-type absorber region and n-type detection region of HgCdTe were modeled to have a thickness of 3 μm and a wavelength cutoff of 2.2 μm, 2.0 μm and 1.8 μm, respectively. Three HDVIP® radiation detectors having a photodiode (referenced as 408, 410 and 412) with a graded multilayer architecture consistent with the photodiode 202 were modeled with the absorber layers having a combined thickness of 3 μm. The photodiodes 408, 410, and 412 were each formed to have: (1) a third absorber layer 104 with a thickness of approximately 1 μm and a wavelength cutoff of 1.5 μm; (2) a graded absorber layer 106 to have a thickness of approximately 1.8 μm and a graded wavelength cutoff in the range of 1.5 μm to 2.2 μm, 2.0 μm or 1.8 μm, respectively; and (3) a first absorber layer 102 with a thickness of approximately 0.2 μm and a wavelength cutoff matching the end range (i.e., 1.5 μm to 2.2 μm, 2.0 μm or 1.8 μm) of the graded cutoff range of the graded absorber layer 106.

As shown in FIG. 4, at a given operating temperature, each of the photodiodes 408, 410 and 412 having a graded multilayer architecture consistent with the photodiode 202 has a dark current noise that is significantly less than the comparative photodiode 402, 404 and 406 having a single homogenous HgCdTe layer with a wavelength cutoff that matches the end of the graded cutoff of the photodiode 408, 410 and 412. For example, at an operating temperature of 200 Kelvin (K), the prior art photodiode 402 with a 2.2 μm wavelength cutoff has a dark current noise of approximately $1.7 \times 10^{-9}$ A/cm² while the comparative photodiode 408 with a graded wavelength cutoff to a 2.2 μm has a significantly less dark current noise of approximately $1.5 \times 10^{-10}$ A/cm².

In addition, as shown in FIG. 4, each of the photodiodes 408, 410 and 412 having a graded multilayer architecture consistent with the photodiode 202 is able to operate at a higher temperature than the comparative photodiode 402, 404 and 406 having a single homogenous $Hg_{1-x}Cd_xTe$ layer for a given dark current noise. Stated another way, the comparative photodiodes 402, 404 and 406 having a single homogenous HgCdTe layer require additional cooling than the photodiodes 408, 410 and 412 having a graded multilayer architecture consistent with the photodiode 202 to achieve the same dark current noise. For example, to operate at a dark current noise level of $1.0 \times 10^{-9}$ A/cm², the prior art photodiode 402 with a 2.2 μm wavelength cutoff must be cooled to approximately 195K while the comparative photodiode 408 with a graded wavelength cutoff to a 2.2 μm is able to operate at a significantly higher temperature of 216K, which is over 20K difference. As a result, a smaller, less costly imaging system may be construed using a photodiode configured using the principles of the present invention because the photodiode does not needs as much cooling.

As an example of the thermal and noise improvements though inclusion of the bandgap engineered absorber in the HDVIP® radiation absorber, a thermal difference $\Delta T_1$ between the comparative photodiode 402 and comparative photodiode 408 is shown to be approximately 20K (185K versus 205K) to achieve the same dark current noise level of $6 \times 10^{-9}$ A/cm². Also, a thermal difference $\Delta T_2$ between the comparative photodiode 404 and comparative photodiode 410 is shown to be approximately 20K (185K versus 205K) to achieve the same dark current noise level of $6 \times 10^{-9}$ A/cm². In addition, a dark current noise level difference $\Delta Jdark_1$ is shown to decrease by approximately $34 \times 10^{-11}$ (i.e., approximately $4 \times 10^{-10}$–approximately $6 \times 10^{-11}$) at a temperature of approximately 186K. Also, a dark current noise level difference $\Delta Jdark_2$ is shown to decrease by approximately $8.2 \times 10^{-11}$ (i.e., approximately $1 \times 10^{-10}$–approximately $1.8 \times 10^{-11}$) at a temperature of approximately 190K.

FIG. 5 is a graph depicting the variation in noise equivalent flux (or irradiance) as a function of operating temperature for the photodiodes 402, 404 and 406 having a single homogenous HgCdTe layer versus the comparative photodiodes 408, 410 and 412 having a graded multilayer structure of HgCdTe. As shown in FIG. 5, for a given operating temperature, each of the photodiodes 408, 410 and 412 with the graded multilayer structure has a significantly less noise equivalent irradiance (NEI, also referenced as noise equivalent flux) than the comparative photodiode 402, 404 and 406 having a single homogenous HgCdTe layer. For example, to achieve NEI of $2.5 \times 10^8$ photons/sec/cm², a very high level of sensitivity that would permit imaging under night glow conditions in a moonless night, the photodiode 412 with the graded gap structure formed to have the graded cutoff range ending at 1.8 μm may be cooled to approximately 226K while the comparative photodiode 406 with the single homogenous HgCdTe layer at 1.8 μm requires further cooling to approximately 212K, a 14K difference, which is a considerable difference at these temperatures, as understood in the art.

As an example of the thermal and noise improvements though inclusion of the bandgap engineered absorber in the HDVIP® radiation absorber, a thermal difference $\Delta T_1$ between the comparative photodiode 402 and comparative photodiode 408 is shown to be approximately 20K (i.e., approximately 175K versus approximately 195K) to achieve the same noise equivalent flux of $2.5 \times 10^{-8}$ ph/s/cm². Also, a thermal difference $\Delta T_2$ between the comparative photodiode 404 and comparative photodiode 410 is shown to be approximately 15K (i.e., approximately 185K versus 200K) to achieve the same noise equivalent flux of $2.0 \times 10^{-8}$ ph/s/cm². In addition, a noise equivalent flux difference $\Delta NEF_1$ is shown to decrease by approximately $0.75 \times 10^{-11}$ (i.e., approximately $2.5 \times 10^{-8}$–approximately $1.75 \times 10^{-8}$) at a temperature of approximately 178K. Also, a noise equivalent flux difference $\Delta NEF_1$ is shown to decrease by approximately $0.35 \times 10^{-11}$ (i.e., approximately $2 \times 10^{-8}$–approximately $1.65 \times 10^{-8}$) at a temperature of approximately 186K.

As apparent from FIGS. 4 and 5, the dark current density reduces further and the operating temperature increases further for a photodiode 408, 410 and 412 having a graded bandgap structure and progressively lower cutoff HgCdTe for the wide bandgap layer 106 and a thinner graded gap absorber region 108, both readily realized in grown HgCdTe.

Figure 6:
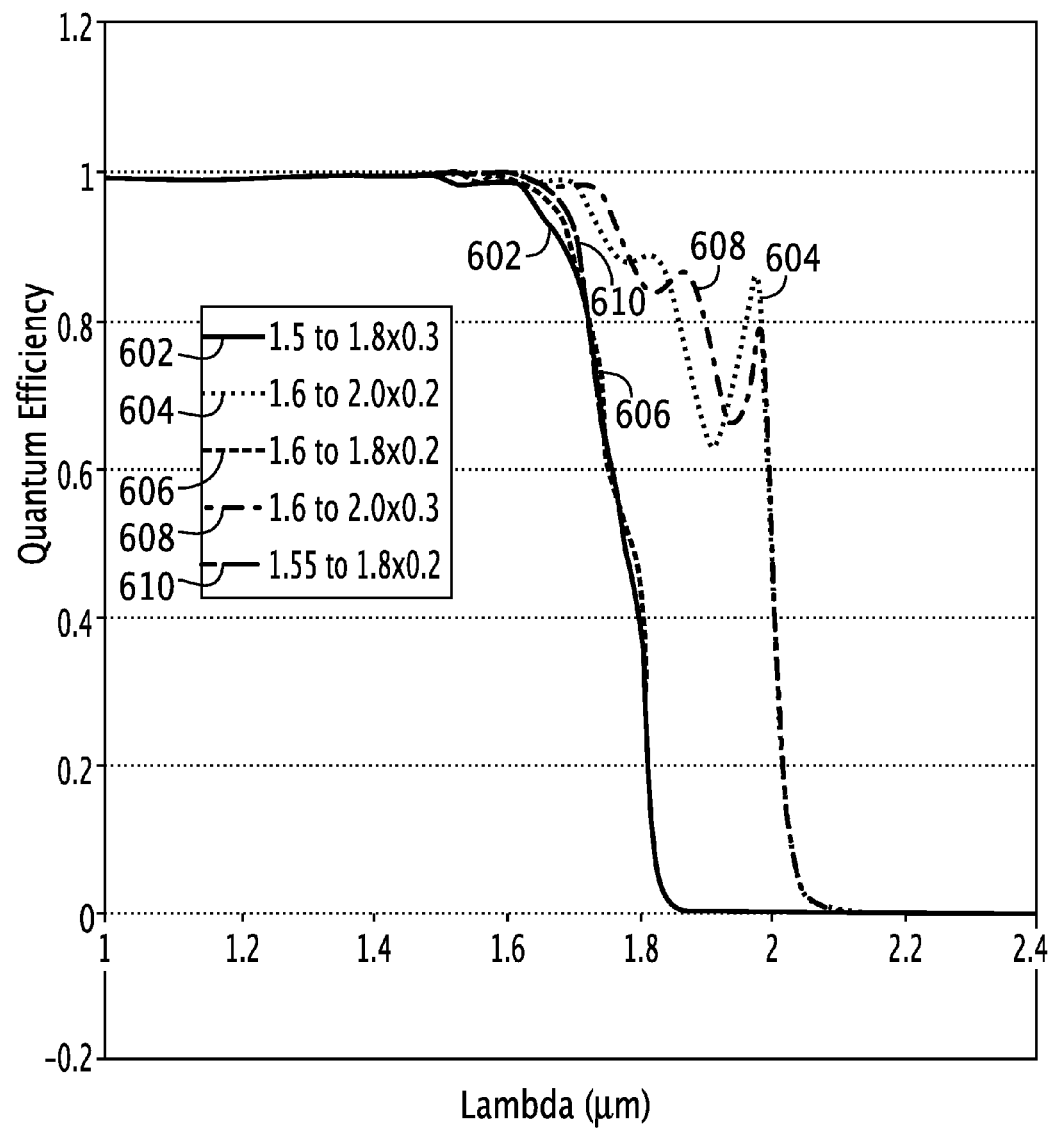
FIG. 6 is a graph depicting illustrative spectral responses in terms of relative quantum efficiency for various several photodiodes formed to have a graded multilayer absorber in accordance with the principles of the present invention.

FIG. 6 is a graph depicting the spectral response in terms of quantum efficiency (QE) for various several photodiodes formed to have a graded multilayer absorber in accordance with the present invention consistent with the photodiode 202 in FIG. 1 where the graded multilayer absorber 106 for each photodiode (referenced as 602-610 in FIG. 6) for different cutoffs of the graded bandgap layer 106 and the 0.2 μm thick narrow bandgap layer 108. The modeling includes standard antireflection coating layers of ZnS and $SiO_2$ but optimized for the 1.0-1.7 μm spectral band. The results, plotted in FIG.

6, show that the average QE is greater than 99% and a minimum QE value of approximately 90% at 1.7 µm wavelengths.

For MWIR and LWIR applications, a mirror on the backside of the detector or on the ROIC enables high QE values while maintaining relatively thin absorber layer structures of 3 µm and 5 µm, respectively.

FIG. 7 is a graph of an illustrative gain 702 of a photodiode having an HDVIP® structure with a homogeneous absorber structure when configured to operate in an avalanche diode mode. It is expected that higher gain at the corresponding bias voltages are expected to be realized with the graded structure in accordance with the principles of the present invention. As understood in the art, a photodiode may be configured in an avalanche diode mode by increasing bias voltage being applied to the photodiode. In this case, the photodiode was measured at 160K on a 12.5 µm pitch 8×8 array of 2.2 µm cutoff diodes. As shown, the gain is shown to be around 100 at a bias voltage of approximately 9.5V. As with the performance improvements, including thermal and dark current density performance improvements, of the photodiode provided in FIG. 2 and illustrated in FIGS. 3-5 over a photodiode with an HDVIP structure having a homogenous layer, the photodiode with the HDVIP structure operating in an avalanche diode mode has the same or analogous performance improvements over a photodiode with an HDVIP structure having a homogenous layer.

FIGS. 8A-8C are images of an illustrative scene produced by three different operating conditions (e.g., three different bias voltages) in which an optical detector with absorber pixels having homogeneous absorber structures with the HDVIP® structure is set. It is expected that increased sensitivity will be realized with the HDVIP® structure with a graded absorber structure in accordance with the principles of the present invention. Each of the images were taken at night using the optical detector at different bias voltage levels. FIG. 8A shows an image 800a taken using the optical detector with a bias voltage set to 0V, which translates to a gain of 1 by the photodiode. Hence, the image 800a is very dark. FIG. 8B shows an image 800b taken using the optical detector with a bias voltage set to 5V, which translates to a gain of 2 by the photodiode. Hence, the image 800b shows improved contrast to see a sign 802. FIG. 8C shows an image 800c taken using the optical detector with a bias voltage set to 5V which translates to a gain of 5 by the photodiode. Hence, the image 800c is obtained at even greater sensitivity so that the sign 802 is more easily seen and the contrast in the image 800c is better than that of the image 800b.

Figure 9:
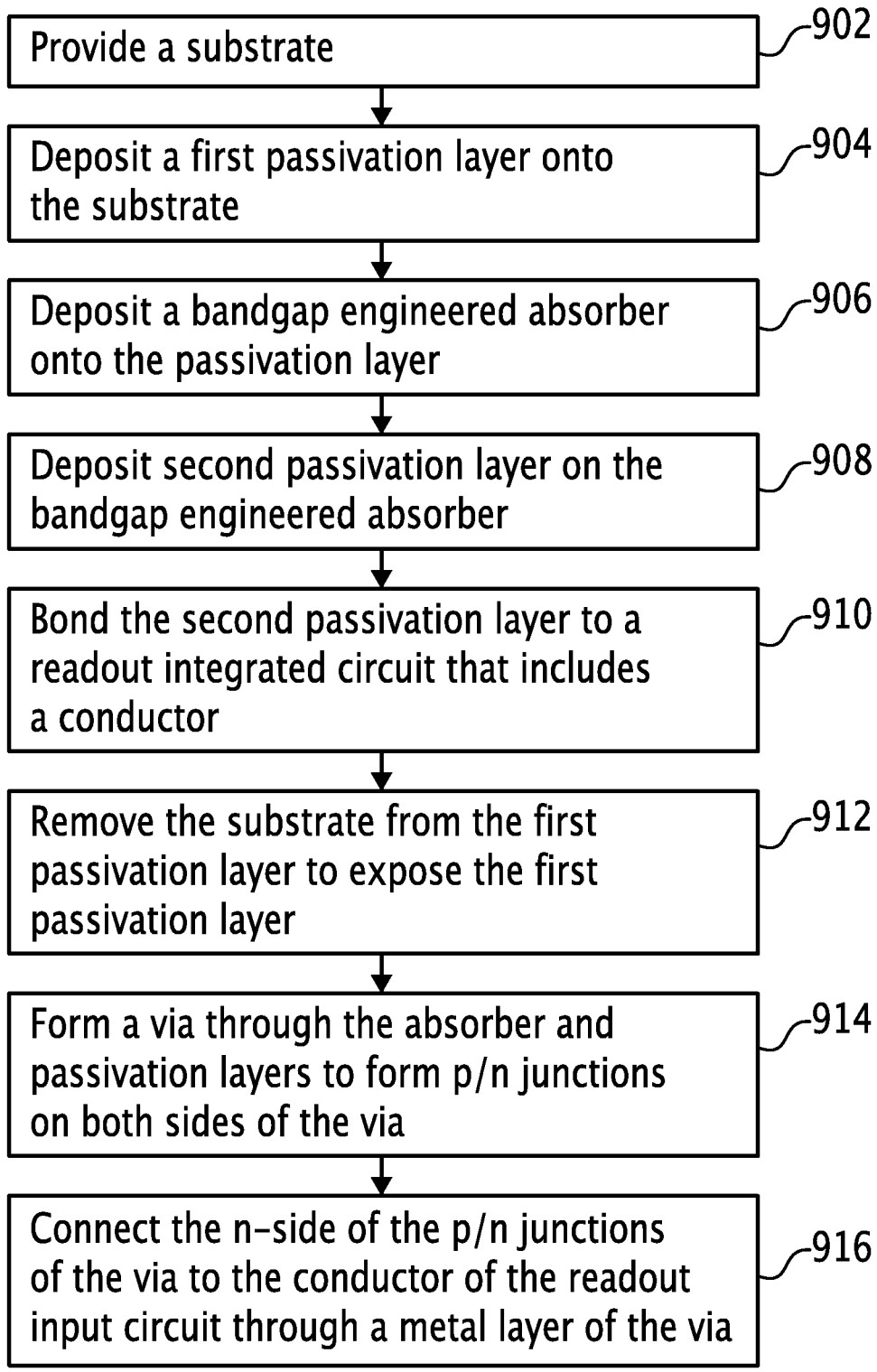
FIG. 9 is a flow diagram of an illustrative process for manufacturing a photodiode having a via, such as provided in the HDVIP® structure of FIG. 2, with a bandgap engineered absorber, such as a graded multilayer absorber structure.

FIG. 9 is a flow diagram of an illustrative process 900 for manufacturing a photodiode having a via, such as provided in the HDVIP structure of FIG. 2, with a bandgap engineered absorber, such as a graded multilayer absorber structure as shown in FIG. 1. The process 900 starts at step 902, where a substrate may be provided. At step 904, a first passivation layer may be deposited onto or grown on the substrate. The deposition may be performed by using vapor deposition or other deposition techniques, as understood in the art. At step 906, a bandgap engineered absorber may be deposited onto the passivation layer. In one embodiment, the bandgap engineered absorber may include a non-homogenous layer, such as a graded absorption layer sandwiched between two homogeneous layers having different wavelength cutoffs, where the graded absorption layer may have a wavelength cutoff gradient ranging between the two different wavelength cutoffs of the respective two homogeneous layers. At step 908, a second passivation layer may be deposited on the bandgap engineered absorber.

At step 910, the second passivation layer may be bonded to a readout integrated circuit layer, where the readout integrated circuit may include a conductor. In one embodiment, epoxy may be used for bonding. The conductor may be used to conduct a current or voltage as a result of the carriers being generated and drifted through the bandgap engineered absorber to an external circuit for measuring radiation sensed by the photodiode, as understood in the art. At step 912, the substrate may be removed from the first passivation layer to expose the first passivation layer. It should be understood that removal of the substrate may alternatively be removed prior to or after step 912. At step 914, a via may be formed through the absorber and passivation layers to form p/n junctions on both sides of the via. As understood in the art, a metal layer may be applied to walls of the via through a metalization process. At step 916, the n-side of the p/n junctions of the via may be connected to the conductor of the readout input circuit through a metal layer of the via.

While various embodiments of the present invention have been described, it will be apparent to those of skill in the art that many more embodiments and implementations are possible that are within the scope of this invention. Accordingly, the present invention is not to be restricted except in light of the attached claims and their equivalents.

What is claimed is:

1. A radiation detector, comprising:
   a photodiode including a radiation absorber having a first surface upon which radiation is received into the radiation absorber, the radiation absorber having a plurality of layers each formed from a semiconductor material,
   a first of the layers is formed to have a first predetermined wavelength cutoff,
   a second of the layers is disposed over the first layer and beneath the first surface of the radiation absorber, the second layer having a graded composition structure of the semiconductor material such that the second layer has a wavelength cutoff that varies from a second predetermined wavelength cutoff to the first predetermined wavelength cutoff, wherein the first of the layers is electrically coupled to the second of the layers, and
   a metal layer is in contact with each of the plurality of layers.

2. The radiation detector according to claim 1, wherein the semiconductor material is HgCdTe.

3. The radiation detector according to claim 2, wherein a third of the absorber layers is disposed on the second layer and defines the first surface of the radiation absorber, the third layer is formed of a homogenous composition of HgCdTe to have the second predetermined wavelength cutoff.

4. The radiation detector according to claim 3, wherein the first thickness of the first layer is minimized to a predetermined value that reflects a tradeoff between dark current at a desired temperature of operation and functionality of the photodiode.

5. The radiation detector according to claim 3, wherein a first thickness of the first layer is 0.2 microns or less.

6. The radiation detector according to claim 5, wherein a second thickness of the second layer is 1.8 microns or greater.

7. The radiation detector according to claim 1, wherein the first layer has a first bandgap and the second layer has a progressively larger bandgap than the first bandgap of the first layer.

8. The radiation detector according to claim 1, wherein a third of the absorber layers is disposed on the second layer, the third layer is formed of a homogenous composition of HgCdTe to have the second predetermined wavelength, and the third layer has a third bandgap that is equal to or greater than the largest bandgap of the second layer.

9. The radiation detector according to claim 1, wherein the radiation absorber is a p-type region of the photodiode and the photodiode has an n-type region that has the same plurality of layers as the p-type region.

10. The radiation detector according to claim 9, wherein the photodiode further includes:
   a via extending through the first and second layers, wherein the via is characterized by walls, and wherein the metal layer coats the walls of the via and is in contact with the n-type region; and
   an input preamp disposed below the first layer with respect to the second layer and part of a readout integrated circuit, the metal layer being in electrical communication with the input preamp.

11. A radiation detector comprising:
   an anti-reflection coating operable to receive radiation;
   a passivation layer disposed adjacent the anti-reflection coating; and
   a photodiode including:
      a first layer of a first semiconductor material adjacent the passivation layer and characterized by a first predetermined wavelength cutoff;
      a second layer of a second semiconductor material adjacent the first layer and having a first surface adjacent the first layer and a second surface opposing the first surface, wherein the second semiconductor material has a graded composition characterized by the first predetermined wavelength cutoff at the first surface and a second predetermined wavelength cutoff at the second surface, the second predetermined wavelength cutoff being greater than the first predetermined wavelength cutoff;
      a third layer of a third semiconductor material adjacent the second layer and characterized by the second predetermined wavelength cutoff; and
      a metal layer in contact with the first layer, the second layer, and the third layer.

12. The radiation detector according to claim 11, wherein the first semiconductor material comprises a homogeneous layer of $Hg_{x-1}Cd_xTe$ and the third semiconductor material comprises a homogeneous layer of $Hg_{y-1}Cd_yTe$.

13. The radiation detector according to claim 11, wherein a thickness of the third layer is 0.2 μm or less.

14. The radiation detector according to claim 13, wherein a thickness of the second layer is 1.8 μm or greater.

15. The radiation detector according to claim 11, wherein:
   the first layer is characterized by a first bandgap;
   the second layer is characterized by the first bandgap at the first surface and a second bandgap at the second surface, the second bandgap being less than the first bandgap; and
   the third layer is characterized by the second bandgap.

16. The radiation detector according to claim 11, wherein the first layer and the second layer are electrically coupled.

17. The radiation detector according to claim 16, wherein the second layer and the third layer are electrically coupled.

* * * * *

UNITED STATES PATENT AND TRADEMARK OFFICE
CERTIFICATE OF CORRECTION

Page 1 of 1

PATENT NO. : 8,772,717 B2
APPLICATION NO. : 12/853174
DATED : July 8, 2014
INVENTOR(S) : Pradip Mitra, Jeffrey D. Beck and Mark R. Skokan It is certified that error appears in the above-identified patent and that said Letters Patent is hereby corrected as shown below:

On the Title Page

Between Item (65) Prior Publication Data and Item (51) International Patent Classification (Inc. Cl.), please insert:

Item -- (60) Related U.S. Application Data
Provisional application No. 61/232,510, filed on Aug. 10, 2009. --

Signed and Sealed this
Thirtieth Day of September, 2014

Michelle K. Lee
*Deputy Director of the United States Patent and Trademark Office*